United States Patent [19]

Martin

[11] Patent Number: 5,731,803
[45] Date of Patent: Mar. 24, 1998

[54] ARRAY WITH LIGHT ACTIVE UNITS SIZED TO ELIMINATE ARTIFACT FROM SIZE DIFFERENCE

[75] Inventor: Russel A. Martin, Menlo Park, Calif.

[73] Assignee: Xerox Corporation, Stamford, Conn.

[21] Appl. No.: 579,048

[22] Filed: Dec. 21, 1995

[51] Int. Cl.$^6$ ........................................ G09G 3/00
[52] U.S. Cl. ................. 345/152; 257/59; 257/72; 257/88
[58] Field of Search ............................. 345/152; 257/59, 257/72, 88, 291

[56] References Cited

U.S. PATENT DOCUMENTS

| | | | |
|---|---|---|---|
| 5,144,288 | 9/1992 | Hamada et al. | 345/152 X |
| 5,381,014 | 1/1995 | Jeromin et al. | 250/370.09 |
| 5,464,984 | 11/1995 | Cox et al. | 250/370.11 |
| 5,473,452 | 12/1995 | Shin | 349/54 |
| 5,475,246 | 12/1995 | Wei et al. | 257/291 |
| 5,480,812 | 1/1996 | Salisbury | 437/3 |
| 5,485,293 | 1/1996 | Robinder | 345/88 |
| 5,486,939 | 1/1996 | Fulks | 349/122 |
| 5,491,347 | 2/1996 | Allen et al. | 257/59 |
| 5,504,348 | 4/1996 | Yoshida et al. | 257/59 |
| 5,508,507 | 4/1996 | Nelson et al. | 250/214 LA |
| 5,546,297 | 8/1996 | DaCosta et al. . | |
| 5,602,679 | 2/1997 | Dolgoff et al. | 359/640 |
| 5,608,245 | 3/1997 | Martin | 257/291 |
| 5,648,674 | 7/1997 | Weisfield et al. | 257/428 |

FOREIGN PATENT DOCUMENTS

546780A1  6/1993  European Pat. Off. ......... G09G 3/36

OTHER PUBLICATIONS

Bond, J., and Levenson, M.D., "The US gears up to challenge Japan in flat panel displays," *Solid State Technology*, Dec., 1993, pp. 37, 38, and 40–43.

Sheng, K.C., Qiu, H., Sondeno, J.R., Lam, J.K., and Addiego, G., "Laser repair processes for mass production of LCD panels," *Solid State Technology*, Jun. 1993, pp. 91, 92, 94, and 95.

Photon Dynamics, Inc., *LCD Flat Panel Repair System User's Manual* 3.0, Part No. 005509, Aug. 1992, pp. 99–134.

Kaneko, E., *Liquid Crystal TV Displays: Principles and Applications of Liquid Crystal Displays*, KTK Scientific Publishers, Tokyo, 1987, pp. 212–277.

U.S. Patent Application No. 08/135,944 entitled "AM TFT LCD Universal Controller" to Lee et al., filed on Oct. 13, 1993.

U.S. Patent Application No. 08/235,015 entitled "Universal Display That Presents All Image Types With High Image Fidelity" to Russel A. Martin et al., filed on Apr. 28, 1994.

U.S. Patent Application No. 08/235,017 entitled "Presenting An Image On A Display As It Would Be Presented By Another Image Output Device Or On Printing Circuitry" to Russel A. Martin et al., filed on Apr. 28, 1994.

*Primary Examiner*—Raymond J. Bayerl
*Assistant Examiner*—Seth D. Vail

[57] ABSTRACT

An array includes first and second light active units with a difference in effective size that would be sufficient to produce an artifact in images if the first and second units were adjacent. Instead of being adjacent, the first and second units are separated by a spacing in which intermediate units form a series extending from the larger unit to the smaller unit. Every unit in the series has an effective size less than the preceding unit, but the size differences between adjacent units are insufficient to produce an artifact. The array can be a display, and the first and second units can be light control units in a column, with the difference in effective size resulting from paired lines adjacent the smaller unit. Spacings between lines bounding rows of light control units can be different, or rows can have nearly constant pitch but dark matrix can define aperture boundaries that have different effective sizes.

13 Claims, 9 Drawing Sheets

1

ARRAY WITH LIGHT ACTIVE UNITS SIZED TO ELIMINATE ARTIFACT FROM SIZE DIFFERENCE

BACKGROUND

The present invention relates to arrays of circuitry fabricated on substrates.

Cox et al., U.S. Pat. No. 5,464,984, describe an x-ray imaging system with a sensor array. As described at col. 10 beginning at line 62, it is desirable to fabricate a large area array with contiguous edge-to-edge sensing of a radiation field. To accomplish this, non-imaging I/O circuitry of a sensor tile must reside interstitially in the imaging area of a pixel array. If the associated I/O pads and circuitry take up space on the imaging plane a loss of resolution and/or dead spots may occur in the image. As shown and described in relation to FIG. 9, an octagonal pixel architecture can maintain high fill factor while allowing for adequate non-imaging area between the pixels to construct peripheral I/O circuitry. A transfer gate added between first and second rows is utilized to allow the first row to be read out and then used as an output shift register.

SUMMARY OF THE INVENTION

The invention addresses a problem that arises in arrays of light active cells fabricated on substrates. Although conventional arrays are typically structured so that every light active cell has the same size, situations arise in which cells must have different sizes. When cells have different sizes, artifacts may arise that reduce image quality. A displayed image, for example, may have perceptible artifacts due to different cell sizes.

Such artifacts can occur when a display array is constructed from distinct parts. Along a boundary between parts, a perceptible line may occur because a small additional space at the boundary enlarges the adjacent rows of cells slightly.

Cox et al., cited above, describe similar artifacts that arise in a tiled sensing array if each tile's I/O pads and circuitry take up space on the imaging plane. Resolution may be lost, and dead spots may occur.

A first aspect of the invention is based on the discovery of a general technique that can alleviate the problem of different cell sizes. The technique spreads a difference in cell size across a series of cells to eliminate an artifact.

The technique can be implemented in an article of manufacture that includes a substrate and array circuitry at a surface of the substrate. The array circuitry includes an array of light active units, each with an effective size. The array circuitry also includes signal circuitry for receiving signals from or providing signals to the light active units. The array of light active units together interacts with images of an image size, for which there is a characteristic minimum size difference between adjacent light active units that is sufficient to produce an artifact in the application in which the array is used. That size difference is referred to herein as the "minimum artifact difference."

A first light active unit has a first effective size, while a second has a second effective size smaller than the first by an overall size difference. The overall size difference is sufficient to produce an artifact in images having the image size were the first and second light active units adjacent each other. But the first and second light active units are separated by a spacing in which a subarray of intermediate light active units form a series of light active units extending from the first light active unit to the second light active unit. Within the series, each intermediate light active unit has an effective size less than the effective size of the preceding light active unit by a first size difference and greater than the effective size of the following light active unit by a second size difference. The first and second size differences of each intermediate light active unit are insufficient to produce an artifact in images having the image size.

Because the differences are insufficient to produce an artifact, the artifact that would have resulted from the overall size difference is eliminated.

The signal circuitry can include two sets of lines that cross, with each light active unit connected to one of each set of lines. The light active unit can be adjacent the region in which the lines to which it is connected cross.

The article can be a display such as an active matrix liquid crystal display (AMLCD), and each light active unit can control presentation of a segment of images. Each unit's effective size can be its aperture area, determined by a spacing between lines that bound it or by an aperture boundary defined by a dark matrix. The overall size difference can result from a pair of scan lines or from a repair line parallel to and alongside one of the scan lines.

A second aspect of the invention is based on the recognition that the technique described above can produce special types of perceptible artifacts in displayed images. The human perceptual system is especially sensitive to line artifacts. A slight misalignment between light control units in a display can produce a perceptible artifact that appears as a break or bending defect in a line.

The second aspect is further based on the discovery that these line artifacts can be reduced even though apertures of light control units have different sizes. If the effective centers of the light control unit apertures are evenly spaced, line artifacts are significantly lessened if not eliminated.

The techniques described above are advantageous because they make it possible to provide an AMLCD with repair lines or with paired scan lines along a split without introducing artifacts due to differences in effective sizes of light control units. The techniques could reduce visibility of an artifact that would occur when a split array is formed by butting or joining two partial arrays.

The following description, the drawings, and the claims further set forth these and other aspects, objects, features, and advantages of the invention.

DETAILED DESCRIPTION

A. Conceptual Framework

Figure 1:
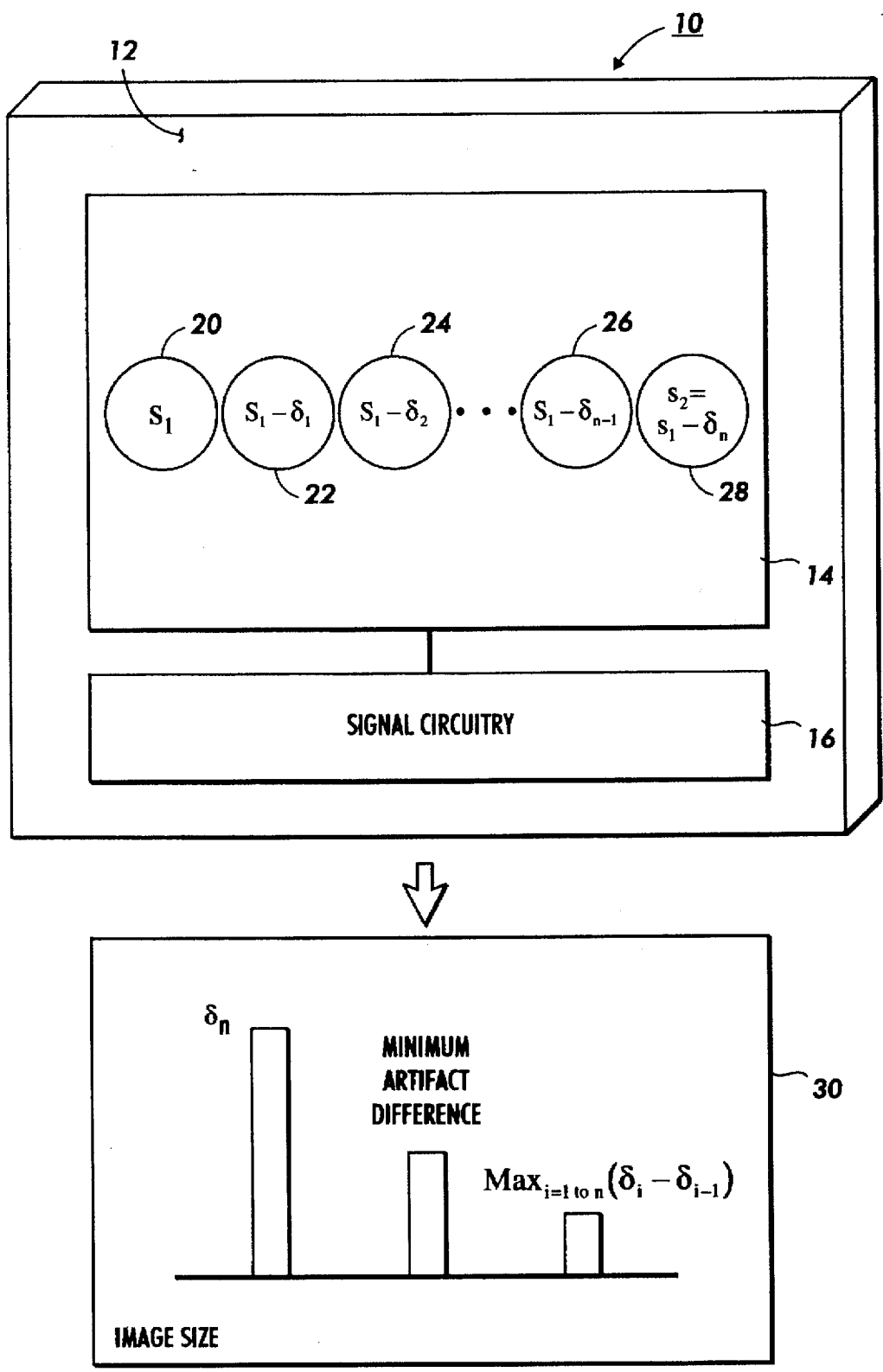
FIG. 1 is a schematic diagram showing how a series of light active units in an array can have differences in effective sizes of adjacent units that are less than a minimum artifact difference even though the overall size difference is greater than the minimum artifact difference.

The following conceptual framework is helpful in understanding the broad scope of the invention, and the terms defined below have the indicated meanings throughout this application, including the claims.

"Circuitry" or a "circuit" is any physical arrangement of matter that can respond to a first signal at one location or time by providing a second signal at another location or time, where the timing or content of the second signal includes information about timing or content of the first signal. Circuitry "transfers" a first signal when it receives the first signal at a first location and, in response, provides the second signal at a second location.

Any two components are "connected" when there is a combination of circuitry that can transfer signals from one of the components to the other. For example, two components are "connected" by any combination of connections between them that permits transfer of signals from one of the components to the other. Two components are "electrically connected" when there is a combination of circuitry that can transfer electric signals from one to the other. Two components could be electrically connected even though they are not in physical contact, such as through a combination of conductive components that are electrically connected between them.

An "electric circuit" is a circuit within which components are electrically connected. An "electric structure" is a physical structure that includes one or more electric circuits.

A "substrate" or "chip" is a unit of material that has a surface at which circuitry can be formed or mounted. An "insulating substrate" is a substrate through which no electric current can flow.

An "integrated circuit" is a circuit formed at a substrate's surface by batch processes such as deposition, lithography, etching, oxidation, diffusion, implantation, annealing, and so forth.

A "lead" is a part of a component at which the component is electrically connected to other components. A "line" is a simple component that extends between and electrically connects two or more leads. A lead of a component is "connected" to a lead of another component when the two leads are electrically connected by a combination of leads and lines. In an integrated circuit, leads of two components may also be "connected" by being formed as a single lead that is part of both components.

A line in an electric structure is "parallel to and alongside" another line in the structure if the lines are parallel and closer to each other than to other lines and there are no other significant parts of the structure between them. Two such lines may, however, be separated by a small number of insulating layers.

The terms "array" and "cell" are related: An "array" is an article of manufacture that includes an arrangement of "cells." For example, a "two-dimensional array" or "2D array" includes an arrangement of cells in two dimensions. A 2D array of circuitry may include rows and columns, with a line for each row and a line for each column. Lines in one direction may be "data lines" through which a cell receives or provides signals that determine or indicate its state. Lines in the other direction may be "scan lines" through which a cell receives a signal enabling it to receive signals from or provide signals to its data line.

A "repair line" is a line in an electric structure that can be used in repairing the electric structure.

Lines in an array are "paired" if they are parallel to and alongside each other.

A "crossing region" is a region in which two lines cross, such as a scan line and a data line.

In an array of circuitry, a cell is a "light active unit" if the cell includes circuitry that can interact with light, such as by sensing light, by emitting light, or by modifying reflected or transmitted light.

An "image" is a pattern of physical light.

An image may be divided into "segments," each of which is itself an image. A segment of an image may be of any size up to and including the whole image.

The "effective size" of a light active unit is a measure of the segment of an image with which the light active unit interacts. The "effective area" of a two-dimensional light active unit is its effective size measured in two dimensions. The "boundary" of a light active unit's effective area is a line that surrounds its effective area.

In an array, two light active units are "separated in the array by a spacing" if the spacing indicates the shortest distance between the boundaries of their effective areas.

A "series of light active units" is a number of light active units that extend from a first light active unit to a last light active unit, within which each intermediate light active unit has a preceding light active unit and a following light active unit, and within which adjacent light active units are not separated by a spacing large enough for an additional light active unit.

Intermediate light active units in a spacing between first and second light active units "form a series of light active units extending from the first light active unit to the second light active unit" if there is a series of light active units that extends from the first light active unit to the second and that includes, in addition, only the intermediate light active units.

An "artifact" is an item of information about an image or another effect produced by an image that does not result from the image itself but that results due to a boundary or other difference between segments interacting with adjacent light active units. Artifacts typically result from sampling that is inherent in interacting with an image as an array of image segments. An artifact can be thought of as a type of spatially constant noise that is added to the image.

In an array of light active units that together interact with images of an image size, a size difference between the effective sizes of two light active units is "sufficient to produce an artifact" in images having the image size if the light active units were adjacent if the ordinary use of the array would produce an artifact resulting from the size difference if the light active units were adjacent.

The "minimum artifact difference" for interactions of an array of light active units with images of an image size is a characteristic minimum size difference between adjacent light active units that is sufficient to produce an artifact in the application in which the array is used.

When an image is a pattern of physical light in the visible portion of the electromagnetic spectrum, the image can produce human perceptions.

An "image output device" is a device that can provide output defining an image.

A "display" is an image output device that provides information in a visible form. A display may, for example, include a cathode ray tube; an array of light emitting, reflecting, or absorbing elements; a structure that presents marks on paper or another medium; or any other structure capable of defining an image in a visible form. To "present an image" on a display is to operate the display so that a viewer can perceive the image.

A "segment of images" presented by a display is at the same relative position within all the images.

Circuitry or a circuit "causes presentation of a segment" or "presents a segment" of images if the segment is presented in response to the circuitry or circuit.

A "light control unit" is a light active unit that is structured to receive a signal and to respond to its signal by causing presentation of an image segment with one of a set of colors; in a monochrome display, the colors are different levels of brightness of a single hue.

The "effective aperture area" of a light control unit is the effective area of image segments that the light control unit causes to be presented.

A light control unit's effective aperture area is "bounded by lines" extending in a direction if the effective aperture area is within a spacing separating the lines.

A "dark matrix" is a component of a display that defines image areas in which nearly all light is absorbed rather than being transmitted or reflected. A dark matrix defines a light control unit's "aperture boundary" if the dark matrix defines a boundary between the light control unit's effective aperture area and a surrounding dark area.

A light control unit's "aperture center" is the center of area of the unit's effective aperture area.

Aperture centers of a series of light control units are "evenly spaced" if the spacings between adjacent units in the series are all approximately equal.

A "usual viewing distance" at which an array of light control units is viewed is a distance at which a human would ordinarily view the array. For example, the usual viewing distance of a computer display is typically between 40–60 cm.

A "human with normal vision" is a human whose vision meets an appropriate criterion for normalcy. For example, the criterion could require 20/20 equivalent or better corrected visual acuity, normal vertical and lateral phoria, normal stereopsis, and normal color vision.

When an image is presented by a display, an artifact is "perceptible" if the artifact would be perceived by most humans with normal vision viewing the image at the display's usual viewing distance. An "ordinary acuity artifact" is a perceptible artifact that is visible only up to spatial frequencies of approximately 60 cycles per degree of visual angle. Examples include boundaries between scan lines, jagged edges, and other features that indicate a boundary or other difference between segments presented by different light control units. Artifacts that are visible to significantly greater spatial frequencies than 60 cycles per degree of visual angle are referred to herein as "hyperacuity artifacts"; an example of a hyperacuity artifact is an offset in a line one light control unit wide.

B. General Features

Figure 2:
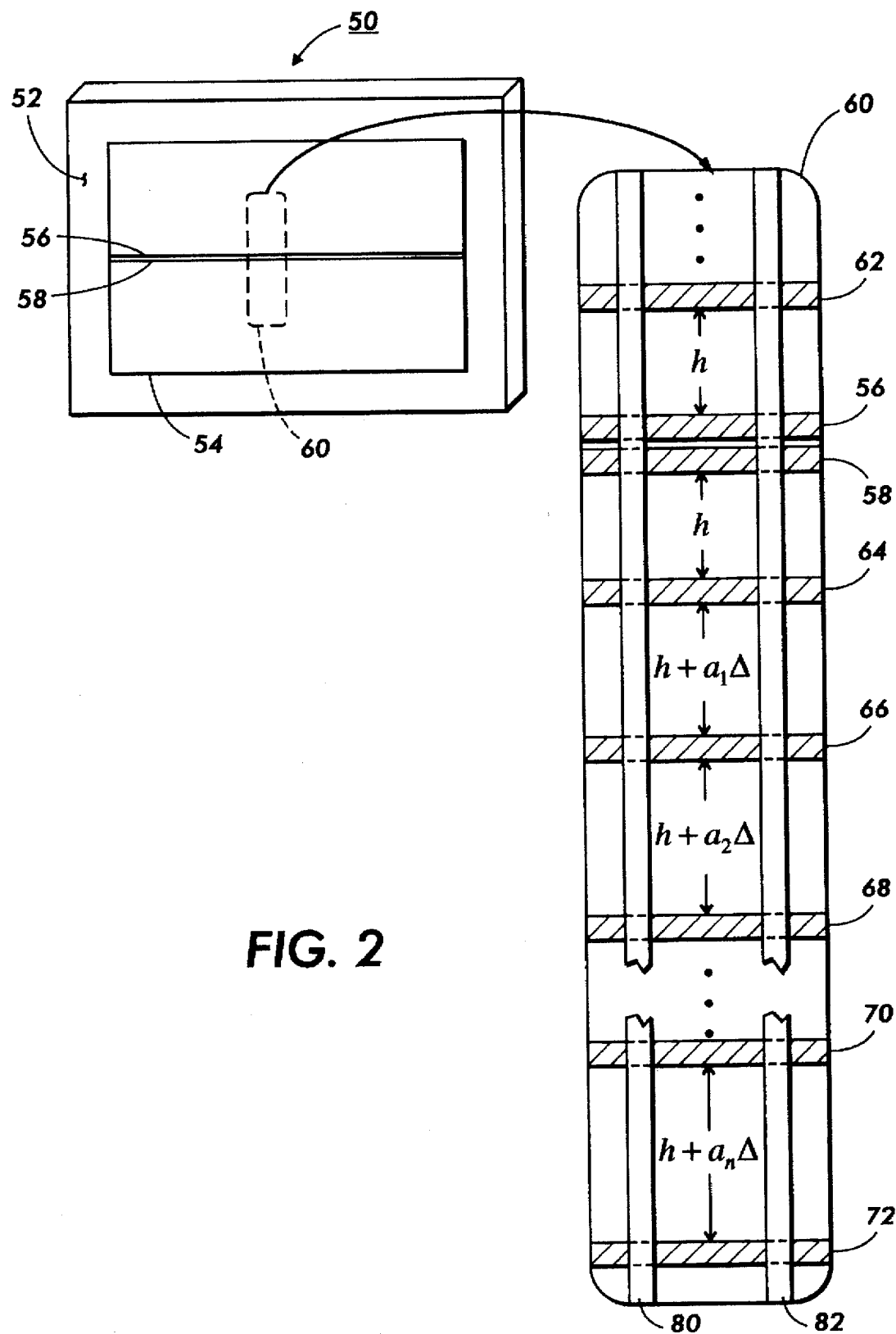
FIG. 2 is a schematic diagram of a display array with paired lines, with a detail showing spacings between lines so that size differences of adjacent light control units are less than the minimum artifact difference.
Figure 3:
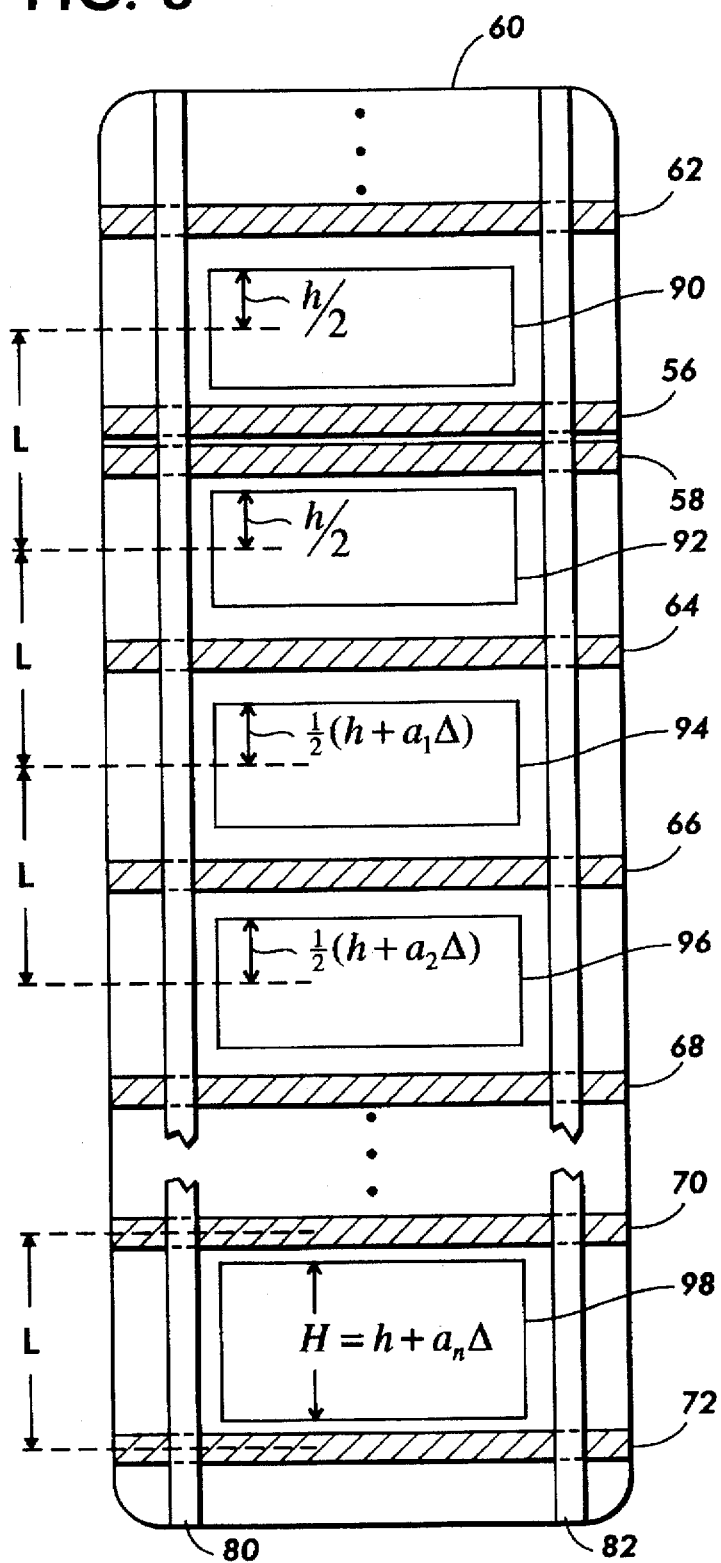
FIG. 3 is an alternative detail of the display array of FIG. 2, showing aperture boundaries defined by a dark matrix so that size differences of adjacent light control units are less than the minimum artifact difference.

FIGS. 1–3 show general features of the invention. FIG. 1 shows an array with a series of light active units in which size differences between adjacent units are less than the minimum artifact difference. FIG. 2 shows a display array in which size differences between line spacings are less than the minimum artifact difference. FIG. 3 shows a display array in which size differences between aperture areas are less than the minimum artifact difference and aperture centers are evenly spaced.

FIG. 1 shows article of manufacture 10 with substrate 12 on the surface of which circuitry is formed. The circuitry includes array 14 of light active units, a series of which are shown in greater detail. The circuitry also includes signal circuitry for receiving signals from or providing signals to light active units in array 14.

Array 14 includes a series of (n+1) light active units 20, 22, 24, 26, and 28. The effective size of each illustrated light active unit is shown in relation to $s_1$, the effective size of light active unit 20, the largest in the series. Light active unit 22 is smaller than light active unit 20 by a first difference $\delta_1$, light active unit 24 is smaller by a second difference $\delta_2$, and so forth for other intermediate light active units in the series. Therefore, light active unit 26 is smaller by an (n−1)th difference $\delta_{n-1}$ and the smallest, light active unit 28, is smaller by an nth difference $\delta_n$. In general, $\delta_i > \delta_{i-1}$, so that the differences increase monotonically through the series, so that each intermediate unit in the series between light active units 20 and 28 has an effective size less than that of the preceding unit in the series and greater than that of the following unit in the series.

FIG. 1 also shows image size 30, the image size with which array 14 interacts. Within image size 30 is a bar graph with three bars representing key differences between effective sizes of adjacent light active units. The left bar represents the size difference $\delta_n$, the difference that would occur if light active units 20 and 28 were adjacent. The middle bar represents the minimum artifact difference ("MAD"), meaning the minimum size difference between adjacent light active units at which an artifact is produced for image size 30 when article 10 is in use. The right bar represents the maximum size difference between adjacent light active units in the series of units 20 through 28, abbreviated as $\text{Max}_{i=1 \text{ to } n}(\delta_i - \delta_{i-1})$. As can be seen, $\delta_n > \text{MAD} > \text{Max}_{i=1 \text{ to } n}(\delta_i - \delta_{i-1})$. Therefore, despite the presence in array 14 of light active units 20 and 28 with an overall size difference $\delta_n$ that would produce artifacts if they were adjacent, adjacent units in the series from unit 20 to unit 28 have effective size differences insufficient to produce an artifact.

FIG. 2 shows display array 50, with substrate 52 on a surface of which array circuitry 54 provides an array of light control units. The signal circuitry for array circuitry 54 has a first set of lines extending left and right and a second set of lines extending up and down. The first set of lines could, for example, be scan lines, and the second set could be data lines. As shown, the signal circuitry includes paired lines 56 and 58 which extend alongside each other and are therefore not separated by a row of light control units. Paired lines 56 and 58 could both be in the first set of lines, but not separated by a row of light control units because they occur at a split in the array. Or one of paired lines 56 and 58 could be in the first set of lines and the other could be an additional line, such as a repair line.

Region 60 of array circuitry 54 is shown in more detail at the right side of FIG. 2. Region 60 includes, in addition to paired left and right lines 56 and 58, single left and right lines 62, 64, 66, 68, 70, and 72 and up and down lines 80 and 82. Lines 56 and 62 are separated by a row of light control units, as are lines 58 and 64, line 64 and 66, lines 66 and 68, and lines 70 and 72. Lines 80 and 82 are separated by a column of light control units.

Because of the presence of paired lines 56 and 58, the spacings immediately above and below, each designated h, are smaller than the spacings between adjacent left and right lines elsewhere in array circuitry 54. If there were no paired lines, the spacings between left and right lines could all take a maximum value of H, the spacing between lines 80 and 82, and the left and right lines could have constant pitch.

To a first approximation, the effective size of light control units in each row is proportional to the spacing between the lines immediately above and below that row, assuming that the up and down lines are all evenly spaced at the same spacing as lines 80 and 82. Therefore, even if the overall difference (H-h) is greater than the minimum artifact difference for the size of images presented by display array 50, it may be possible to make all the differences in spacing between adjacent rows less than the minimum artifact difference by slightly modifying the pitch of rows near paired lines 56 and 58. In effect, the pitch of the rows adjacent paired lines 56 and 58 can be increased slightly to compensate for the extra line, while the pitch of the next rows can be decreased slightly because they do not include extra lines and therefore must be more closely spaced to provide an appropriate effective size.

As shown in FIG. 2, the spacing between lines 64 and 66 is greater than h by $a_1\Delta$, between lines 66 and 68 greater by $a_2\Delta$, and between lines 70 and 72 greater by $a_n\Delta$, which is equal to the overall difference (H-h) so that $h+a_n\Delta=H$. If $a_i=i$, for example, then all the differences in spacing between adjacent rows are equal to $\Delta$; if $\Delta$ is less than the minimum artifact difference, it is an insufficient difference to produce a perceptible artifact. Equal differences like this may be advantageous because they minimize the rate of change in effective size over any particular distance. More generally, if $\Delta$ is less than the minimum artifact difference and $a_i-a_{i-1}\leq 1.0$ for all values of i from 1 to n, each of the differences in spacing will be insufficient to produce a perceptible artifact.

The pitch changing approach in FIG. 2 could, however, result in line defect artifacts if it results in apertures that are not evenly spaced. Since the effective size of each light control unit depends on its aperture area, and since the effective position of each light control unit is the center of its aperture area, an even better approach may be to shape light control unit apertures while keeping pitch constant wherever possible, as illustrated in FIG. 3.

FIG. 3 shows the same lines as in FIG. 2, and aperture areas 90, 92, 94, 96, and 98 which remain after a dark matrix is applied over the lines. The pitch between the centers of lines 70 and 72 is L, which is the same as the pitch between the centers of aperture areas 90 and 92, aperture areas 92 and 94, and aperture areas 94 and 96. Aperture areas 90 and 92, however, are reduced to size h due to the presence of paired lines 56 and 58 between them, with h/2 both above and below the center of each aperture area. As can be seen, aperture area 90 is spaced more from line 62 than from line 56, and aperture area 92 is similarly spaced more from line 64 than from line 58.

Aperture area 94 has a height of $h+a_1\Delta$, again divided equally above and below its center. Aperture area 96 has a height of $h+a_2\Delta$, again divided equally above and below its center. And aperture area 98 has a height of $H=h+a_n\Delta$, also divided equally above and below its center. As a result of these heights, the same analysis applies to FIG. 3 as to FIG. 2: If $a_i=i$, for example, then all the differences in spacing between adjacent rows are equal to $\Delta$; if $\Delta$ is less than the minimum artifact difference, it is an insufficient difference to produce a perceptible artifact. More generally, if $\Delta$ is less than the minimum artifact difference and $a_i-a_{i-1}\leq 1.0$ for all values of i from 1 to n, each of the differences in spacing will be insufficient to produce a perceptible artifact.

C. Implementation

The general features described above could be implemented in numerous ways for a variety of applications. For example, the general features could be implemented using nearly any conventional AMLCD technology, but adding one or more repair structures within the array region so that a repair can be made as described above. The implementation described below can be made using AMLCD technology described in U.S. Pat. No. 5,491,347, entitled "Thin-Film Structure With Dense Array of Binary Control Units for Presenting Images" ("the Dense Array Application") incorporated herein by reference.

C.1. Layout

Figure 4:
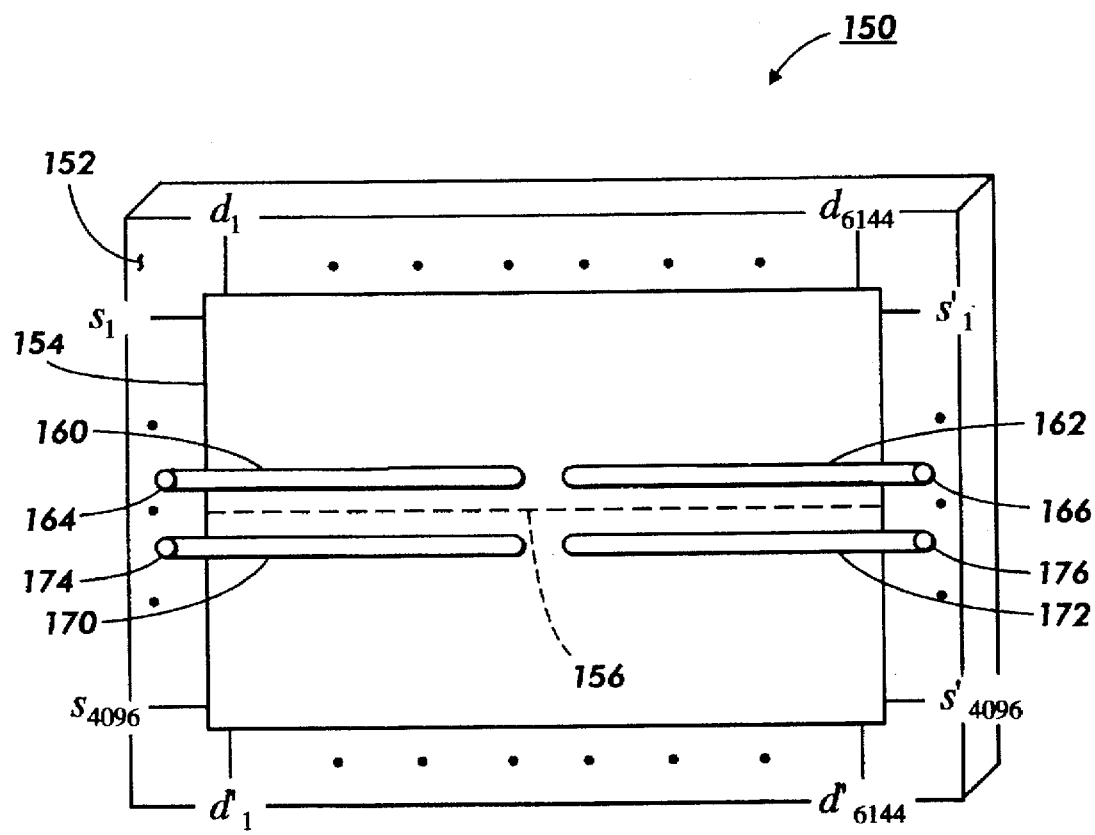
FIG. 4 is a schematic diagram showing a 4096×6144 split array with two repair structures, each with two repair lines along a split line.
Figure 5:
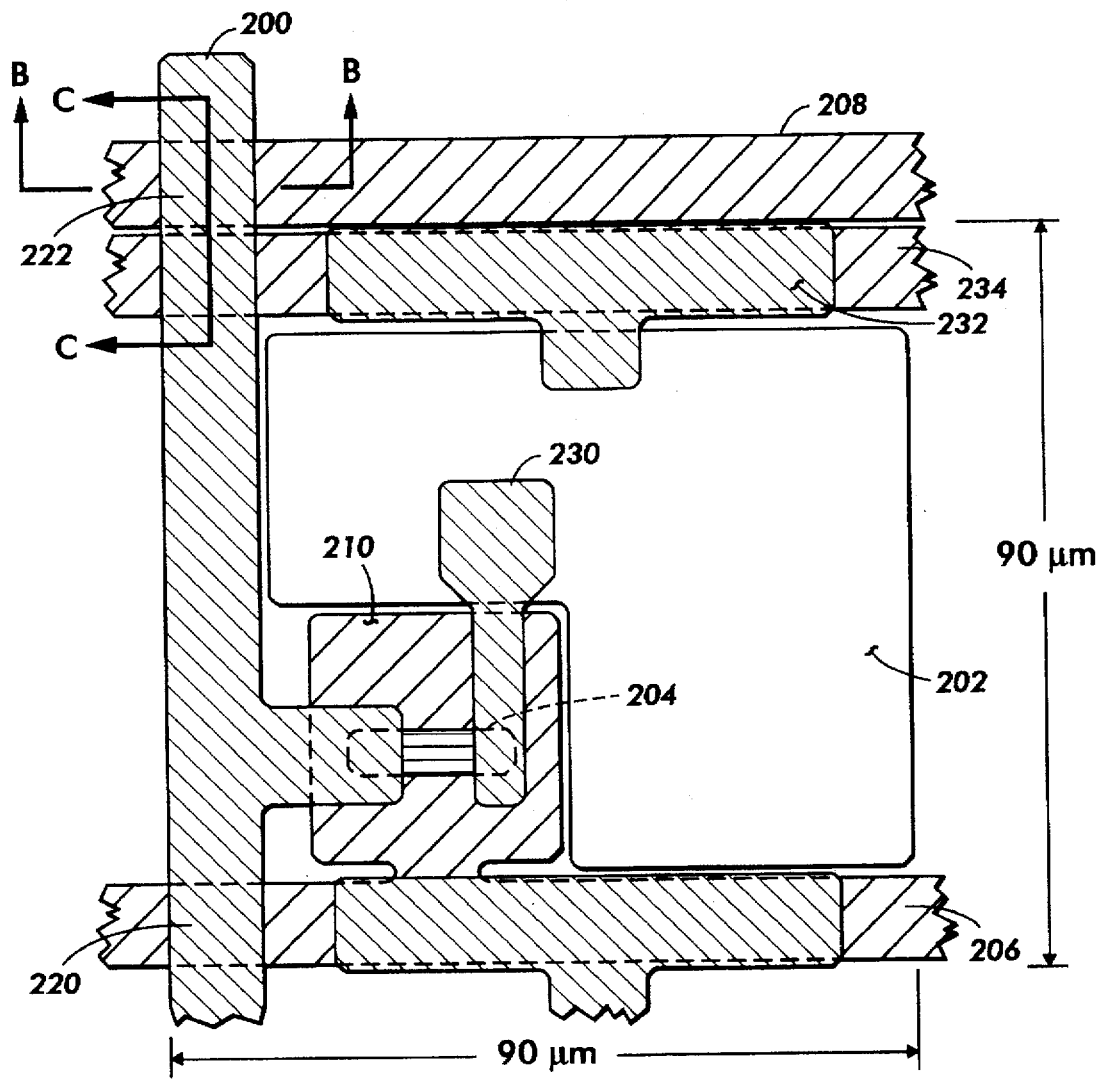
FIG. 5 is a schematic layout diagram showing a cell in the array of FIG. 4 in which a repair lines is parallel to and alongside a scan line.
Figure 6:
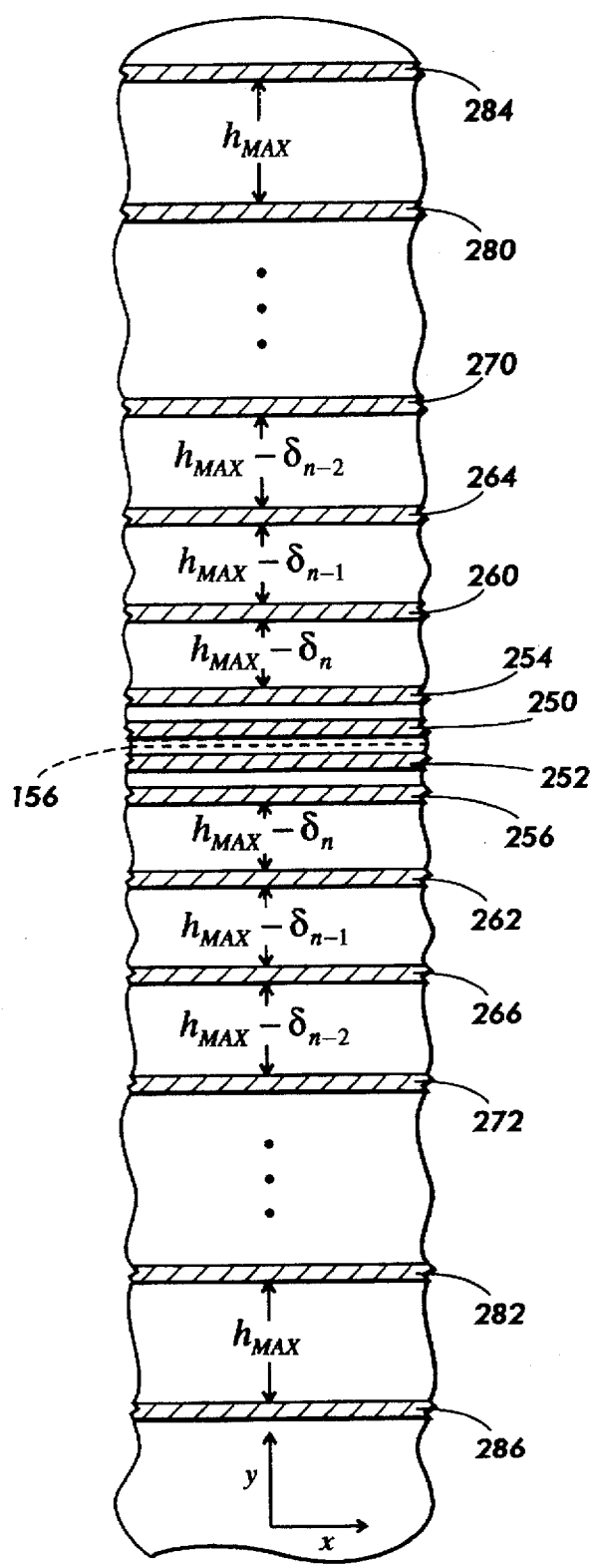
FIG. 6 is a schematic layout diagram showing sizes of rows of light control units near the split line in the array of FIG. 4.

FIGS. 4–6 show features of a layout of a split array. FIG. 4 shows layout of array circuitry on a substrate. FIG. 5 shows layout of a cell that is crossed by a repair line. FIG. 6 shows spacings between lines in the bottom metal pattern that includes gate lines and repair lines.

Figure 7:
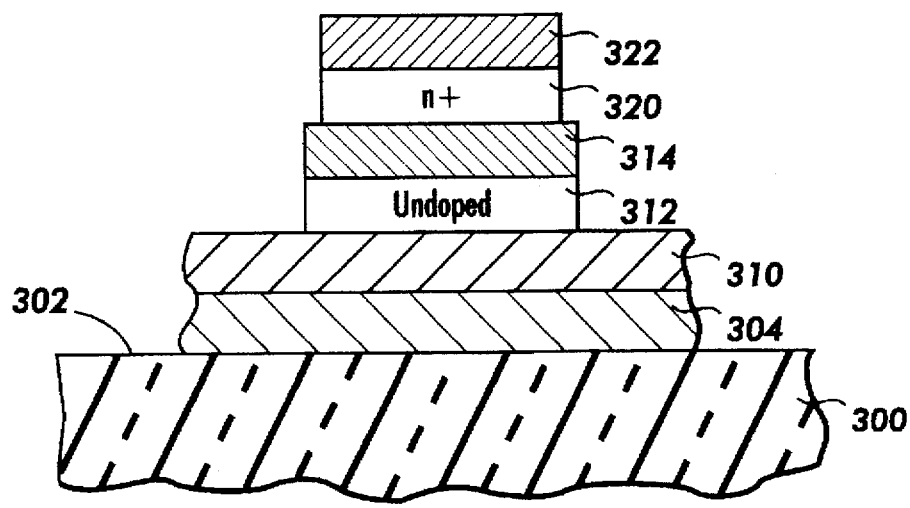
FIG. 7 is a cross sectional view along the line B—B in FIG. 5.

Display array 150 in FIG. 4 includes substrate 152, which can be a transparent glass sheet as described in relation to FIG. 7 of the Dense Array Application. Array region 154 on the surface of substrate 152 is split into upper and lower array regions along split line 156. 4096 scan lines, with signal leads $s_1$ through $s_{4096}$ on the left and with signal leads $s'_1$ through $s'_{4096}$ on the right, extend across array region 154, with 2048 scan lines above split line 156 and 2048 below. 6144 data lines, extend across each part of array region 154 with the data lines above split line 156 having signal leads $d_1$ through $d_{6144}$ at the upper side and with the data lines below split line 156 having signal leads $d'_1$ through $d'_{6144}$ at the lower side and with the data lines above and below split line 156 collinear.

The circuitry in array region 154 also includes two repair structures. The upper repair structure is along the upper side of split line 156, and includes repair lines 160 and 162 in array region 154 and connecting leads 164 and 166 outside array region 154. The lower repair structure is along the lower side of split line 156, and includes repair lines 170 and 172 in array region 154 and connecting leads 174 and 176 outside array region 154.

FIG. 5, which is a modified version of FIG. 3 of the Dense Array Application, shows a layout for a light control unit. FIG. 5 shows several layers, with upper layers that are farthest from the substrate's surface obscuring lower layers. The uppermost layer shown in FIG. 5 is a top metal layer, which forms data line 200 connected to a channel lead of an amorphous silicon (a-Si) transistor that switches the light control unit; the top metal layer also forms several other features described below. The next layer shown is a layer of indium-tin-oxide (ITO), which forms transparent electrode 202. The next layer is a top nitride layer, which forms insulating island 204, part of the transistor; the top nitride is an insulating layer that can form other features as mentioned below. The lowest layer shown is a bottom metal layer, which forms gate line 206, repair line 208, and, connected to gate line 206, gate lead 210, which serves as the gate lead of the transistor.

Data line 200 provides a data signal to a column of light control units, one of which is shown in FIG. 5. The part of data line 200 that extends over gate lead 210 connects to one channel lead of the transistor. Gate line 206 similarly provides a scan signal to a row of light control units.

Data line 200 and gate line 206 are illustratively each 10 µm wide, and repair line 208 can be of approximately the same width, as shown. Data line 200 crosses over gate line 206 in crossover region 220 and over repair line 208 in repair crossing region 222. Crossover region 220 and repair crossing region 222 can each include an insulator formed by the top nitride layer and other features as necessary to ensure that the lines conduct signals adequately and that signals in the lines do not interfere.

Transparent electrode 202 connects to the other channel lead of the transistor through line 230, formed by the top metal layer. Therefore, when the transistor is conductive due to a scan signal provided to gate lead 210 by gate line 206, transparent electrode 202 receives and stores a drive signal from data line 200 through line 230.

Transparent electrode 202 also connects to charging lead 232, which implements one electrode of a storage capacitor and is formed by the top metal layer. Gate line 234, formed by the bottom metal layer, implements the other electrode of the storage capacitor; gate line 234 also provides a scan signal to the next light control unit in the same column.

The light control unit shown in FIG. 5 is square, and an array of identical light control units would have effective widths in the row and column directions of 90 µm×90 µm.

The patterned layers shown in FIG. 5 can be produced using the technique described in relation to FIG. 4 of the Dense Array Application. The bottom metal pattern can include repair line 208 and can also include peripheral lines that cross data lines outside the array region.

FIG. 6 shows part of the layout of the bottom metal pattern along split line 156 in greater detail. Along split line 156 are repair lines 250 and 252, laid out in the manner illustrated in FIG. 5. Parallel to and alongside repair lines 250 and 252 are scan lines 254 and 256, respectively.

Each of the light control units could be laid out as illustrated in FIG. 5, with the rows above split line 156 rotated 180°. In this case, scan lines 260 and 262 control the first rows of light control units along split line 156, while scan lines 254 and 256 are dummy scan lines, not themselves providing scan signals but necessary to provide capacitor electrodes for the first rows of light control units. Scan lines 214 and 216 control second rows of light control units bounded on the opposite side by scan lines 260 and 262, respectively. Scan lines 270 and 272 similarly control third rows of light control units bounded on the opposite side by scan lines 264 and 266, respectively; scan lines 280 and 282 control nth rows of light control units; and scan lines 284 and 286 control (n+1)th rows of light control units bounded on the opposite side by scan lines 280 and 282.

Alternatively, the light control units in the first rows along split line 156 could be laid out with repair lines along the scan lines that drive the first rows, in which case scan lines 254 and 256 control the first rows of light control units; scan lines 260 and 262 control the second rows; scan lines 264 and 266 control the third rows; and so forth.

FIG. 6 shows sizes in the y-direction of rows of light control units between adjacent lines in the bottom metal pattern. The sizes shown can either indicate the actual spacing in the y-direction between adjacent lines or the aperture size in the y-direction that, when taken with the actual aperture size in the x-direction, would produce the actual aperture area of each light control unit between the lines. In either case, the sizes are such that a human viewer with normal vision viewing display array 150 at usual viewing distances cannot perceive a difference between single lines such as lines 260, 262, 264, 266, 270, 272, 280, 282, 284, and 286 on the one hand and, on the other hand, grouped lines such as lines 250, 252, 254, and 256.

The size of the row of light control units between adjacent lines 280 and 284 and between adjacent lines 282 and 286 is $h_{MAX}$, the largest size that occurs in the array. As explained above, 2n rows of light control units are between lines 280 and 282, n above split line 156 and n below. The rows next to split line 156, referred to above as the first rows, have a size of $(h_{MAX}-\delta_n)$, the smallest size shown. The second rows have a size of $(h_{MAX}-\delta_{n-1})$, the third rows $(h_{MAX}-\delta_{n-1})$, and so forth until the nth rows have a size of $(h_{MAX}-\delta_1)$. If the centers of lines 280 and 282 are spaced by exactly $2n(h_{MAX}+h_{LINE})$, assuming $h_{LINE}$ to be the width of each line, then $2n(h_{MAX}+h_{LINE})=(2n+2)h_{LINE}+(2nh_{MAX}-2\Sigma\delta_i)$ for i from 1 through n. Therefore, $h_{LINE}=\Sigma\delta_i$, so that the total of the $\delta_i$ on each side of split line 156 is the same as one line width.

The $\delta_i$ should increase monotonically from $\delta_1$ through $\delta_n$. If the $\delta_i$ increase by equal increments $\Delta=\delta_1$, then $\Sigma\delta_i=(n^2+n)\Delta$ and we obtain $\delta_i=i\Delta=(ih_{LINE})/(n^2+n)$. For the layout of FIG. 5, $h_{LINE}=10$ µm and $h_{MAX}=80$ µm, so that if n=10, for example, then $\Delta=0.09$ µm, and the smallest size $(h_{MAX}-\delta_n n)$ =70.1 µm. Although the difference between light control units of 80 µm and light control units of 70.1 µm might be perceptible if they were juxtaposed, when the transition between them is in increments of 0.09 µm, perceptibility is decreased.

On the other hand, if the minimum mask resolution is 0.5 µm, the increments can be no smaller than 0.5 µm. For the situation where increments are constrained by minimum mask resolution, it may be preferable to step the $\delta_i$ by equal increments $\Delta=\delta_1$ after groups of rows, such as after each 10th row. In this and similar situations, larger values of n may be appropriate, such as n=100. This approach spreads the difference over a larger area, which may also decrease perceptibility.

To avoid perceptible artifacts due to off-centered light control units, each single line or group of lines can be centered on the appropriate position and the apertures of the light control units can be adjusted.

The approach of FIG. 6, with four lines grouped along split line 156, may work best with light control units that have large aperture areas and are separated by relatively narrow lines, because the proportional difference between adjacent rows of light control units will be relatively small. For light control units separated by relatively wide lines, it may be preferable to move the repair line a row away from split line 156, leaving three pairs of lines rather than a group of four lines, although this may result in some additional capacitance with the repair lines.

C.2. Structure

Figure 8:
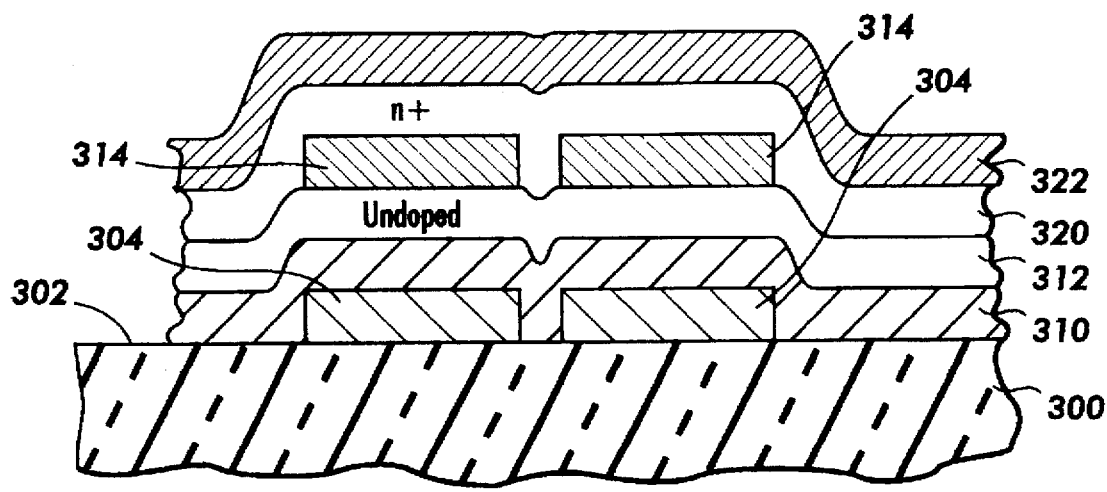
FIG. 8 is a cross sectional view along the line C—C in FIG. 5.

FIGS. 7 and 8 show features of a structure laid out as described above. FIG. 7 shows a cross section along line B—B in FIG. 5. FIG. 8 shows a cross section along line C—C in FIG. 5. The cross sections in FIGS. 7 and 8 can be understood more fully from U.S. Pat. No. 5,486,939, entitled "Thin-Film Structure With Insulating and Smoothing Layers Between Crossing Conductive Lines" ("the Crossing Lines Application"), incorporated herein by reference. The structure shown in FIGS. 7 and 8, which are similar respectively to FIGS. 8 and 9 of the Crossing Lines Application, can be produced using the process in FIG. 7 of the Crossing Lines Application, which is substantially the same as FIG. 4 of the Dense Array Application. Layers of the same material are similarly shaded and bear the same reference number in the two drawings.

Substrate 300 has surface 302 at which a thin-film structure is formed, beginning with bottom metal layer 304. FIG.

7 shows part of bottom metal layer 304 in repair line 208 in FIG. 5, while FIG. 8 shows repair line 208 at right and scan line 234 at left. Over bottom metal layer 304 is bottom nitride layer 310, followed by undoped amorphous silicon layer 312. Over amorphous silicon layer 312 is top nitride layer 314. Over top nitride layer 314 where it exists and over amorphous silicon layer 312 elsewhere is n+ amorphous silicon layer 320. Over n+ layer 320 is top metal layer 322. Over top metal layer 322 and other exposed layers can be a passivation layer (not shown).

Additional features of the structure in FIGS. 7 and 8 can be understood from the description in the Crossing Lines Application.

C.3. Test and Repair

Figure 9:
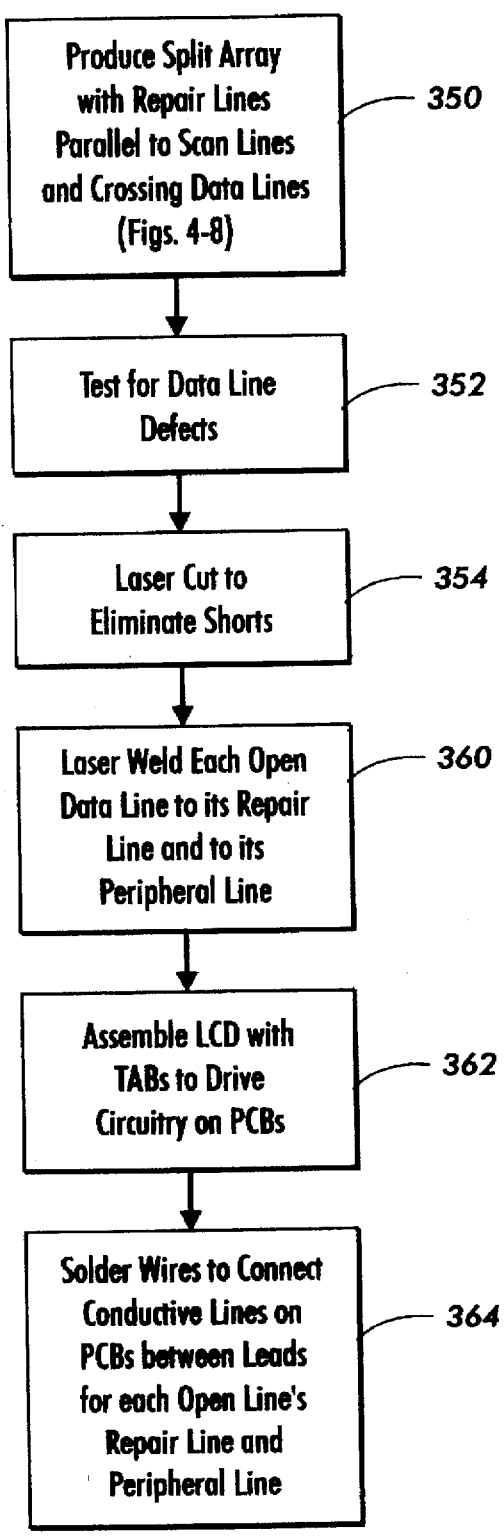
FIG. 9 is a flow chart showing acts in repairing open data lines in the array of FIG. 4.
Figure 10:
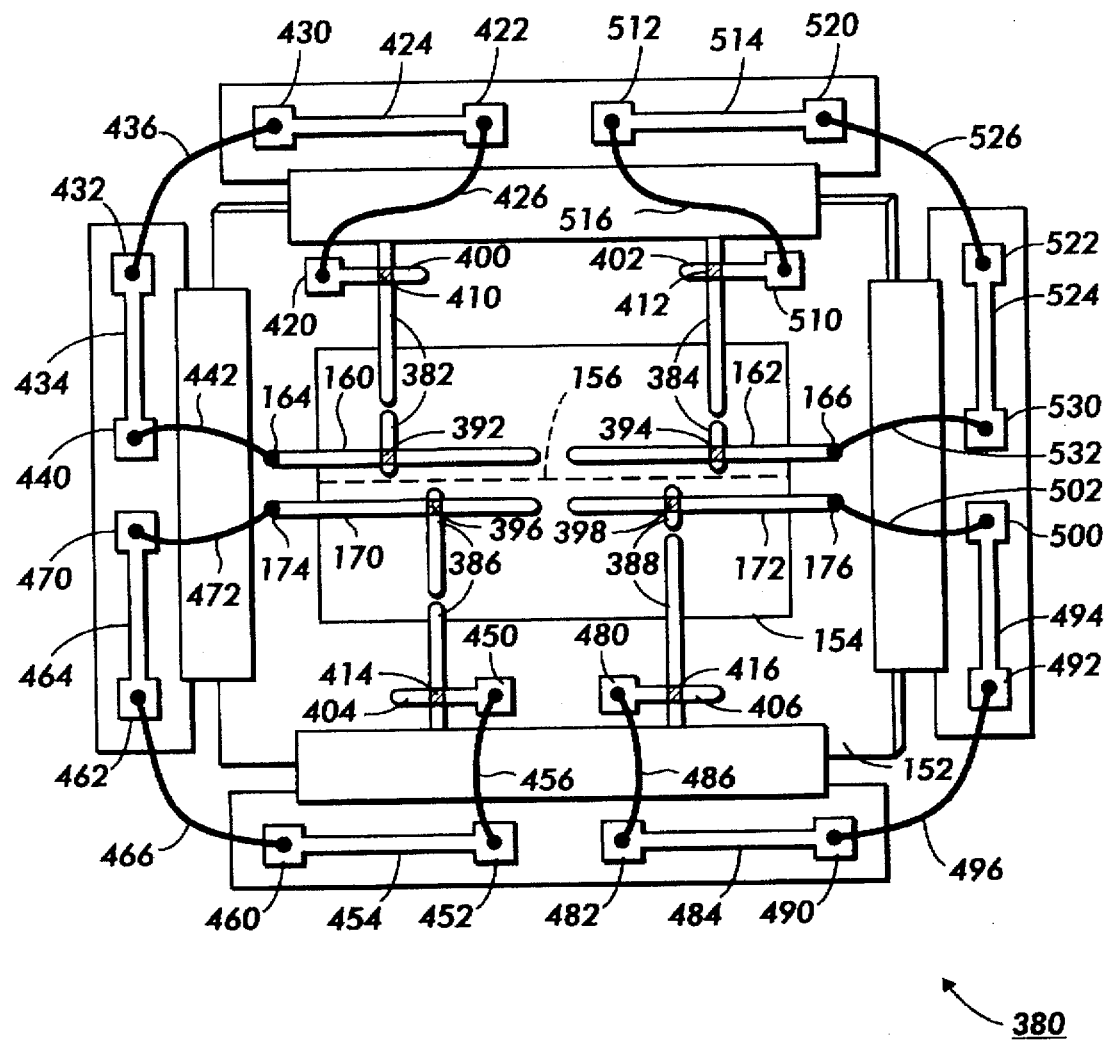
FIG. 10 is a schematic diagram showing a repaired array produced by the technique of FIG. 9.

FIGS. 9 and 10 show features of repair techniques. FIG. 9 shows acts in testing and repairing a split array with repair lines as described above. FIG. 10 shows a repaired array.

The act in box 350 in FIG. 9 begins by producing a split array that includes repair lines that are parallel to scan lines and that cross data lines. The act in box 350 can be implemented as described above in relation to FIGS. 4–6.

The act in box 352 then tests the split array for data line defects. Since each data line has only one accessible lead, this cannot be done with conventional continuity testing. Instead, test equipment such as the In-Process Tester (IPT) from Photon Dynamics, Inc., Milpitas, Calif. can be used to find defects in the array. As explained by Bond, J., and Levenson, M. D., "The US gears up to challenge Japan in flat panel displays," Solid State Technology, December 1993, pp. 37, 38, and 40–43, the IPT can use a noncontact method of performing voltage imaging on AMLCDs before cell assembly. The IPT can scan the substrate with light to collect data on the location and type of line defects, testing all the data lines.

The act in box 354 repairs data line shorts by laser cutting to eliminate each short. This act may include cutting a data line to create an open on each side of a short to a scan line, for example. This act can be performed with the Photon Dynamics LCD Panel Repair System using the integrated laser trim (ILT) capability described in the Sheng et al. article cited above.

The act in box 360 repairs data line opens, including any created in box 354, by laser welding each open data line to a repair line that it crosses and to a peripheral line that it crosses. This act can also be performed with the Photon Dynamics LCD Panel Repair System, but using the integrated laser weld (ILW) capability described in the Sheng et al. article cited above to produce conductive paths between lines that cross.

The act in box 362 then assembles an LCD in the manner described in the Dense Array and Crossing Lines Applications, but with TABs as described above connecting leads on the split array to drive circuitry on PCBs around the edge of the split array. Because each data line in each part of the split array must be driven, data drivers cannot be interdigitated with alternate data lines driven from opposite ends. Instead, each data line must be driven, both from the top and from the bottom of the split array. Therefore, data drivers must be on 90 μm pitch, which may be achieved with overlapping TAB drivers or fine pitch TABs. Data drive circuitry may also be connected using techniques like those described in copending coassigned U.S. Patent application Ser. No. 08/458,539, entitled "Display With Array and Multiplexer on Substrate and With Attached Digital-to-Analog Converter Integrated Circuit Having Many Outputs," incorporated herein by reference.

The act in box 364 completes repair of data line opens by soldering wires for each open data line so that one or more highly conductive lines on the PCBs are electrically connected between the connecting lead of the data line's repair line and the lead of the data line's peripheral line.

FIG. 10 shows features of a repaired array produced by the technique of FIG. 9 using array 150 in FIG. 4, with array region 154 on a surface of substrate 152, and with repair lines 160, 162, 170, and 172 having connecting leads 164, 166, 174, and 176, respectively. PCBs are connected around the edge of substrate 152 by TABs as in FIGS. 1 and 8.

Open lines 382, 384, 386, and 388 are electrically connected to repair lines 160, 162, 170, and 172 by laser welds 390, 392, 394, and 396, respectively. Open lines 382, 384, 386, and 388 are also electrically connected to peripheral lines 400, 402, 404, and 406 by laser welds 410, 412, 414, and 416, respectively.

Lead 420 on peripheral line 400 is electrically connected to lead 422 on conductive line 424 by wire 426. Lead 430 on conductive line 424 is in turn connected to lead 432 on conductive line 434 by wire 436. Lead 440 on conductive line 434 is in turn connected to connecting lead 664 by wire 442, completing the repair of open line 382.

Lead 450 on peripheral line 404 is electrically connected to lead 452 on conductive line 454 by wire 456. Lead 460 on conductive line 454 is in turn connected to lead 462 on conductive line 464 by wire 466. Lead 470 on conductive line 464 is in turn connected to connecting lead 674 by wire 472, completing the repair of open line 386.

Lead 480 on peripheral line 406 is electrically connected to lead 482 on conductive line 484 by wire 486. Lead 490 on conductive line 484 is in turn connected to lead 492 on conductive line 494 by wire 496. Lead 500 on conductive line 494 is in turn connected to connecting lead 676 by wire 502, completing the repair of open line 388.

Lead 510 on peripheral line 402 is electrically connected to lead 512 on conductive line 514 by wire 516. Lead 520 on conductive line 514 is in turn connected to lead 522 on conductive line 524 by wire 526. Lead 530 on conductive line 524 is in turn connected to connecting lead 666 by wire 532, completing the repair of open line 384.

C.4. Variations

The implementation described above could be changed in many ways within the scope of the invention.

The above implementation provides an array appropriate for an AMLCD, but the invention could be implemented in another type of display array, in another type of light valve array, or in another array in which light active units interact with images.

The above implementation provides an array of cells with particular dimensions and densities. The invention could be implemented with a wide variety of array sizes and shapes, cell sizes and shapes, and cell densities.

The above implementation adjusts sizes of cells due to a group of four lines. The invention could provide appropriately sized light active units in various other situations, including situations in which lines are paired or in which a light active unit's effective size is reduced by a line that crosses the center of the unit.

The above implementation provides a split array with four repair lines along the split as described in greater detail in U.S. Pat. No. 5,608,245, entitled "Array on Substrate With Repair Line Crossing Lines in the Array," incorporated herein by reference. The invention could be implemented, however, with an array that is not split or with an array with more or less repair lines or with repair lines positioned elsewhere within an array.

The above implementation eliminates artifacts resulting from grouped lines that cross data lines, but the invention could be implemented to eliminate artifacts from grouped lines that cross scan lines.

The above implementation provides an active matrix array, but the invention could also be implemented in a passive matrix array.

The above implementation uses particular materials in a thin-film structure, but other materials could be used in other types of structures to implement the invention. Some examples are discussed in the Dense Array Application. For example, an array could be implemented with polysilicon TFTs rather than amorphous silicon TFTs, and some of the drive circuitry could be integrated on the same substrate as the array. Rather than metal lines, the data lines and scan lines could include other conductive materials such as doped semiconductive material. Rather than silicon nitride, the insulating layers could include other insulating materials.

The implementation described above provides thin film circuitry on an insulating substrate. The invention could be implemented with other types of circuitry on other types of substrates.

The above implementations use particular processes to produce a thin-film structure, but other processes could be used.

The implementation described above provides circuitry with specific geometric characteristics, but the invention could be implemented with different geometries.

The above implementation uses a specific layout for each cell in an array, but other layouts could be used, including a layout in which a repair line is along the opposite side of the cell, as mentioned above in relation to FIG. 6.

The implementation described above includes layers in a specific sequence, but the sequence of layers could be modified, such as by producing a top gate TFT structure or a structure in which scan lines cross over data lines.

D. Application

The invention could be applied in many ways, including elimination of artifacts in display arrays, light valve arrays, and other arrays that interact with images.

E. Miscellaneous

The invention has been described in relation to thin-film implementations, but the invention might be implemented with single crystal technology.

Although the invention has been described in relation to various implementations, together with modifications, variations, and extensions thereof, other implementations, modifications, variations, and extensions are within the scope of the invention. The invention is therefore not limited by the description contained herein or by the drawings, but only by the claims.

What is claimed:

1. An article of manufacture comprising:

a substrate with a surface at which circuitry can be formed;

array circuitry formed at the surface of the substrate, the array circuitry comprising:

an array of light active units; each light active unit having an effective size; the array of light active units together interacting with images having an image size; and signal circuitry for receiving signals from or providing signals to the light active units;

the array of light active units including:

a first light active unit that has a first effective size;

a second light active unit that has second effective size smaller than the first effective size by an overall size difference; the overall size difference being sufficient to produce an artifact in images having the image size if the first and second light active units were adjacent to each other; the first and second light active units being separated in the array by a spacing; and a subarray of intermediate light active units in the spacing that form a series of light active units extending from the first light active unit to the second light active unit; each intermediate light active unit having an effective size less than the effective size of the light active unit preceding it in the series by a first size difference and greater than the effective size of the light active unit following it in the series by a second size difference; the first and second size differences of each intermediate light active unit being insufficient to produce an artifact in images having the image size.

2. The article of claim 1 in which the signal circuitry comprises:

a first set of lines extending across the surface of the substrate;

a second set of lines extending across the surface of the substrate so that each of the first set of lines and each of the second set of lines cross in a crossing region;

each light active unit being electrically connected to one of the first set of lines and one of the second set of lines and adjacent the crossing region of the lines to which it is electrically connected.

3. The article of claim 1 in which the article is a display; each light active unit being a light control unit for causing presentation of a segment of images.

4. The article of claim 3 in which each light control unit has an aperture within which the light control unit causes presentation of its segment; the effective size of each light control unit being an area of its aperture.

5. The article of claim 4 in which each light control unit has an effective center of its aperture; the effective centers of the light control units in the series being evenly spaced.

6. The article of claim 4 in which the series extends in a first direction; each light control unit's aperture having a transverse size in a second direction perpendicular to first direction; the transverse size of all the light control units in the series being substantially equal.

7. A display comprising:

a substrate with a surface at which circuitry can be formed;

array circuitry formed at the surface of the substrate, the array circuitry comprising:

scan lines extending in a first direction;

data lines extending in a second direction approximately perpendicular to the first direction so that each data line crosses a scan line in a crossing area; and light control units, each electrically connected to one of the scan lines and one of the data lines so that the light control unit receives signals from its data line under control of signals from its scan line; each light control unit responding to signals from its data line causing presentation of a segment of images; each light control unit having an effective aperture area, the light control unit's effective aperture area being the effective area of image segments presented by the light control unit; each scan line providing signals to a row of the light control units; each data line providing signals to a column of the light control units; the array of light control units together presenting images having an image size;

a first column of the light control units including:

a first light control unit that has a first effective aperture area;

a second light control unit that has a second effective aperture area smaller than the first effective aperture area by an overall size difference; the overall size difference being sufficient to produce a perceptible artifact in images having the image size if the first and second light control units were adjacent to each other; the first and second light control units being separated in the column by a spacing; and one or more intermediate light control units in the spacing that form a series of light control units extending from the first light control unit to the second light control unit; each intermediate light control unit having an effective aperture area less than the effective aperture area of the light control unit preceding it in the series by a first size difference and greater than the effective aperture area of the light control unit following it in the series by a second size difference; the first and second size differences of each intermediate light control unit being insufficient to produce a perceptible artifact in images having the image size.

8. The display of claim 7 in which each light control unit's effective aperture area is bounded by lines extending in the first direction, each light control unit's bounding lines being separated by a spacing; the spacing of the first light control unit's bounding lines being greater than the spacing of the second light control unit's bounding lines by the overall size difference; the spacing of each intermediate light control unit's bounding lines being less than the spacing of the bounding lines of the light control unit preceding it in the series by the first size difference and greater than the spacing of the bounding lines of the light control unit following it in the series by the second size difference.

9. The display of claim 7, further comprising a dark matrix that defines, for each light control unit, an aperture boundary that has a size in the second direction; the size in the second direction of the first light control unit's aperture boundary being greater than the size in the second direction of the second light control unit's aperture boundary by the overall size difference; the size in the second direction of each intermediate light control unit's aperture boundary being less than the size in the second direction of the aperture boundary of the light control unit preceding it in the series by the first size difference and greater than the size in the second direction of the aperture boundary of the light control unit following it in the series by the second size difference.

10. The display of claim 7 in which each light control unit's effective aperture area is centered about an aperture center; the aperture centers of the light control units in the column being evenly spaced.

11. The display of claim 7 in which first and second ones of the scan lines are paired; the second light control unit being along the first scan line.

12. The display of claim 7 in which the array circuitry further comprises a repair line parallel to and alongside a first one of the scan lines; the second light control unit being along the first scan line.

13. The display of claim 7 in which the display is an active matrix liquid crystal display.

\* \* \* \* \*